June 2, 1959 M. E. PARADISE 2,889,490

SOLAR POWERED LIGHT SOURCE OR THE LIKE

Filed Oct. 3, 1955

MAURICE E. PARADISE
*INVENTOR.*

BY [signature]

HIS ATTORNEY

United States Patent Office 2,889,490

Patented June 2, 1959

2,889,490

SOLAR POWERED LIGHT SOURCE OR THE LIKE

Maurice E. Paradise, Highland Park, Ill., assignor to Hoffman Electronics Corporation, a corporation of California Application October 3, 1955, Serial No. 538,229

2 Claims. (Cl. 315—157)

This invention is related to devices which utilize the phenomenon of photon emission from the sun to develop and store electrical energy for subsequent usage to power a source of light in the visible wave length region, and more particularly to a new and improved solar powered device which produces in the daytime or nighttime intermittent visible flashes of light, this device being characterized by long-time reliability and extreme portability.

Of current interest is the development of the solar cell, as it is called, that is, means responsive to impinging photon emanations from the sun or other source for developing a corresponding D.C. potential—a photoelectric transducer. Photo sensitive semiconductors, which generally constitute the structure of solar cells, are either point contact devices or p-n junction semiconductors. The junction may be either of the grown, the alloyed, or the diffused variety. P-N junction semiconductors have thus far proven to be the most satisfactory for incorporation in solar cells. The basic principle of operation is that photons generated by the solar source are permitted to impinge upon a p-n junction semiconductor in the region of the junction, in order to produce hole-electron pairs. It is well known that it is not necessary for the hole-electron pairs to be generated in the junction itself to produce a current, but merely in such regions that there is a good probability of the carrier's diffusing to the junction. With present efficiencies it has been found that several p-n junction semiconductor devices must be series-connected in order to develop a practicable D.C. voltage. Lens systems are frequently employed with a battery of solar cells in order to assure a maximum of photon impingement upon each cell for a given ambient light intensity. To be operated satisfactorily, solar cells are hermetically sealed, and, by such sealing the solar cell life becomes almost indefinite. Batteries comprising small numbers of solar cells have been found to be very adequate for small loads. Hence, any light source to be powered by such cells must exhibit a low power consumption. In the present invention the light source is a simple relaxation oscillator employing one or more neon tubes. This is the direction which the present invention pursues.

Therefore, it is an object of the present invention to provide a new and useful intermittent light source which is supplied electric power by one or more solar cells.

It is a further object of the present invention to provide a new and useful light source having a solar cell power supply in which the light source itself is turned off automatically during the day, and in which the light source resumes its intermittent operation automatically at night.

It is a further object of the present invention to provide a novel circuit in which a relatively low voltage solar cell is adapted for powering high voltage inert gas filled tubes.

According to the present invention, a solar cell or a battery of such cells is coupled in charging relationship across a secondary battery power supply associated with an inert gas tube relaxation oscillator. Relaxation tube oscillators in the various embodiments generate either a low voltage or a high voltage output for application to the gas tube. If desired, a resistor may be included in the solar cell circuit to supply a bias voltage which cuts off the gas tube during the day or at any other time when the solar cell or solar battery is generating a potential.

The features of the present invention which are be-believed to be novel are set forth with particularity in the appended claims. The present invention, both as to its organization and manner of operation, together with further objects and advantages thereof, may best be understood by reference to the following description, taken in connection with the accompanying drawings, in which:

Figure 3:
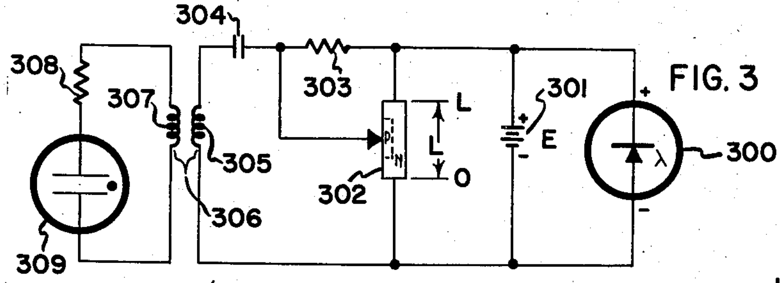
Figure 3 is an additional embodiment of the present invention in which, as a result of high current surges through an inductive reactance, high voltage is supplied the associated gas tube.
Figures 4A, 4B, 4C:
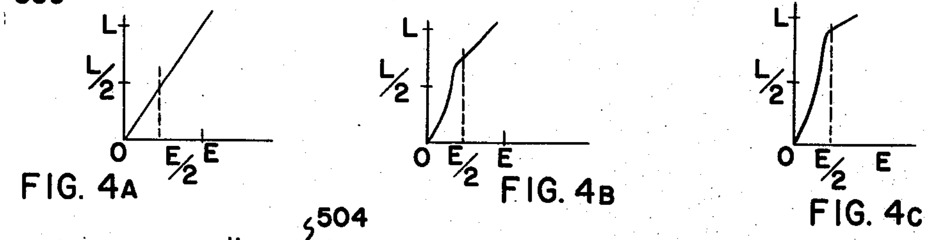

Figures 4A, 4B, and 4C are diagrams relating to the characteristic of the doubled-based diode employed in the circuitry of Figure 3.

Figure 5:
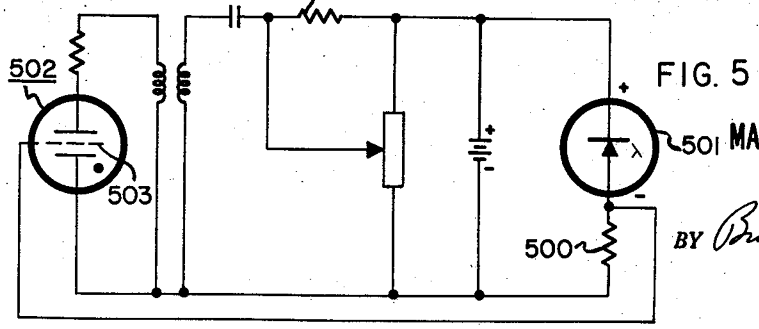

Figure 5 is a modification of the high voltage relaxation tube oscillator circuit of Figure 3.

Figure 1:
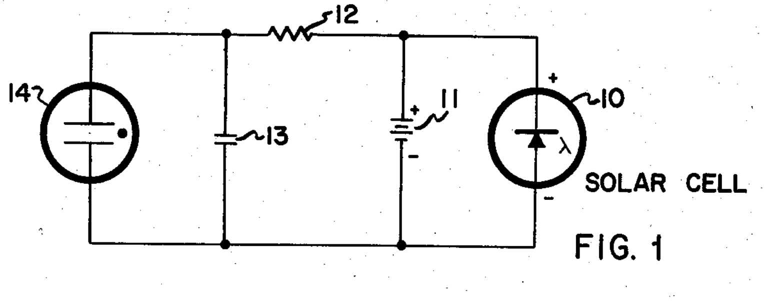
Figure 1 is a schematic diagram of a solar powered light source according to the present invention.

In Figure 1, solar cell unit 10 (consisting of one or more cells and hereinafter referred to as "solar cell") is coupled across battery 11, which in turn is coupled through an R-C integrating circuit consisting of resistor 12 and capacitor 13 to inert gas filled tube 14. Solar cell 10 is a photovoltaic device and preferably exhibits a generally higher terminal voltage than battery 11 and may comprise any one of the several types of solar cells being developed at the present time, though a solar battery made up of a plurality of diffused junction semiconductors would be preferable. There are many types of secondary batteries which may be employed as battery 11 in Figure 1, as for example the Gould hermetically sealed nickel-cadmium storage cell, which may be recharged an indefinite number of times and has an extended life. If desired, both solar cell 10 and battery 11 may be enclosed in a single, hermetically sealed casing. Or, if desired, the entire circuitry of Figure 1 may be included in a single hermetically sealed container. Tube 14 may be a conventional neon tube or other type of cold cathode, gas tube.

The circuit of Figure 1 operates as follows. The combination of battery 11, resistor 12, capacitor 13, and tube 14 constitutes an elementary relaxation oscillator the operation of which is well known. The moment that battery voltage is applied to the circuit, capacitor 13 charges through resistor 12 until the ionization potential of tube 14 is reached, at which time tube 14 fires permitting capacitor 13 to discharge therethrough. Hence the voltage signal impressed across tube 14 will be one of intermittent peak amplitude. If desired, a current limiting resistor may be included in the circuit of tube 14. The inclusion of solar cell 10 in the circuit of Figure 1 adds novelty to the circuit in that during the day photons impinging upon the solar battery or cell 10 will generate current to charge battery 11. At night in the absence of artificial light solar cell 10 becomes inoperative, so far as the generation of electrical energy is concerned, but would draw a slight current from battery 11. This current would be extremely small because of the high back-resistance of solar cell 10. If desired, a diode may be appropriately placed in the solar cell circuit to prevent battery 11 from discharging through solar cell 10 during the night hours. The inclusion of diode 200 in the circuit of Figure 2 exemplifies this feature which is equally adaptable to the circuit of Figure 1.

Figure 2:
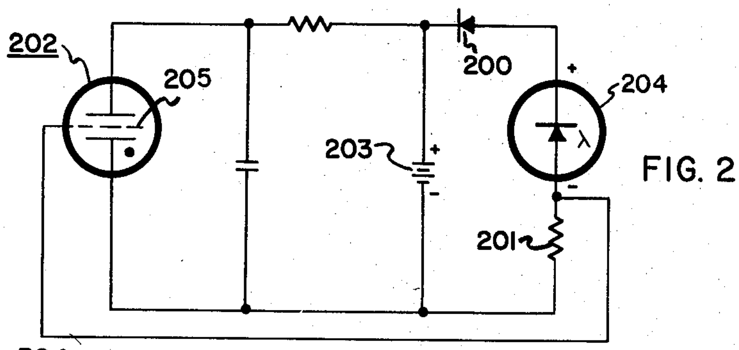
Figure 2 is a schematic diagram of a modification of the circuit of Figure 1 in which a grid-controlled, inert gas filled tube is employed.

The circuit of Figure 2 is substantially the same as that of Figure 1 with the exception of the inclusion of diode 200 in the solar cell circuit, the inclusion of bias resistor 201, and a substitution of triode glow tube 202 for tube 14 in Figure 1.

The circuit of Figure 2 operates as follows. As is hereinbefore explained, in the absence of artificial light, current flows in the solar cell circuit only during daylight hours, the back-resistance of diode 200 and of solar cell 204, itself, preventing discharge of battery 203 through cell 204. Hence, in the daytime hours, the bias voltage developed across resistor 201 is applied to control electrode 205 which accordingly renders tube 202 non-conductive during the day, when operation of the light is not necessary. This biasing feature will further serve to enhance the long life of battery 203. When night arrives, current ceases to flow through the solar cell circuit and the bias voltage is removed from control electrode 204 of tube 202 allowing tube 202 to conduct intermittently, the intervals between conduction being determined by the R-C time constant of the circuit. Hence, the circuit of Figure 2 will be operative only at nighttime or under low ambient light conditions, which is to be desired.

In Figure 3, solar cell 300 is coupled across battery 301 which is in turn coupled across the bases of double-based diode 302. Resistor 303 is coupled between the emitter and one of the base terminals of diode 302. The emitter is also coupled through capacitor 304 and primary winding 305 of transformer 306 to the opposite base of double-based diode 302. Secondary winding 307 of transformer 306 is coupled through current limiting resistor 308 to the opposite terminals of gas tube 309.

The circuit shown in Figure 3 operates as follows. Again, solar cell 300 will supply current to the circuit only when photons are impinging upon the sensitive surfaces thereof. In order to understand the operation of this circuit, one must recall the theory of operation of double-based diodes. For this reason, attention is directed to the characteristic curves of double-based diodes, as indicated in Figures 4A, 4B, and 4C. Consider the n acceptor portion of double-based diode 302 to be of length L and that the p emitter portion of the double-based diode lies substantially half-way between the extremities of the n portion. Then, by virtue of the imposition of a voltage across the bases of double-based diode 302 by battery 301 there will exist in the n acceptor portion a potential gradient which will be substantially linear, as is indicated in the diagram of Figure 4A. Thus, considering the applied battery voltage to be of magnitude E, the potential adjacent the center of the p emitter region will be $E/2$. Now, upon applying battery voltage E to the circuit of Figure 3, capacitor 304 will commence to charge through the parallel combination of resistor 303 and the back-resistance of the upper portion of double-based diode 302. The situation described in Figure 4A is not stable, however, even considering for the moment that the voltage across capacitor 304 were held constant, since, as the holes diffuse into the n acceptor portion from the p emitter portion, they will drift toward the negative end of the acceptor portion under the influence of the transverse electric field in that portion. The presence of the holes lowers the resistivity of this portion so that the potential along the acceptor portion redistributes itself in a way represented by Figure 4B. It is to be noticed that the $E/2$ point on the curve is raised considerably above $L/2$ so that more than half of the p portion is biased as an emitter. Soon afterwards, substantially all of the p portion will be biased as an emitter, as is indicated by the continued heightening of the $E/2$ point on the curve in Figure 4C. The p emitter portion, now being fully biased as an emitter, allows capacitor 304 to discharge suddenly through primary winding 305. This current surge in primary winding 305 of transformer 306 appears as a voltage pulse in the secondary winding circuit which fires neon tube 309. Current limiting resistor 308 reduces the current flow to the tube so as to prevent damage thereto. The discharge of capacitor 304 through the double-based diode 302 restores the emitter ($L/2$ region) potential to a very low value, thus rendering diode 302 substantially non-conducting. As soon as this non-conductive state is attained, the capacitor 304 again recharges through resistor 303 and the back-resistance of the upper portion of double-based diode 302, and the cycle is resumed. Hence, the objective in view, namely that of deriving from a low voltage source a high voltage to fire tube 309 is achieved.

It will be seen that, in essence, double-based diode 302 accomplishes the same result as that of a conventional thyratron; that is, by virtue of triggered high current surges, a large output voltage may be obtained from a relatively small voltage source. There are in recent development many types of semiconductor devices which may be employed in lieu of double-based diode 302. Indeed, articles are presently being published concerning recent developments in "thyratron" transistors. One such transistor provides the characteristically large current surge when the base current is cut off by a triggered bias voltage. It will be understood, of course, that whether the double-based diode of Figure 3 is employed, or whether any one of the several thyratron transistors extant is used, the invention presented by the applicant's circuit in Figure 3 remains unchanged.

The circuit of Figure 5 is substantially identical with that of Figure 3 with the exception that, as in Figure 2, bias resistor 500 is included in the circuit of solar cell 501 and grid-controlled gas tube 502 is employed instead of a conventional two-electrode neon tube. Again as in Figure 2, resistor 500 is included to supply a bias voltage to the control electrode 503 of tube 502 during the existence of ambient light to prevent the firing thereof, whereas at night or in the absence of ambient light solar cell 501 is dormant and the bias voltage is removed.

It should be mentioned that if it is desirable to have two firings spaced a large time interval apart, then resistors 303 in Figure 3 and 504 in Figure 5 may be removed and merely the back-resistance of the double-based diode may be employed for a charging path to the associated capacitor.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. In combination: a storage battery; a solar cell coupled in charging relationship across said battery; a bias resistor connected in series with said battery and said solar cell; a series-connected resistor and capacitor combination coupled across said battery; and an inert gas filled triode tube having two terminal electrodes coupled across said capacitor, and having a control electrode coupled to the junction of said bias resistor and said solar cell whereby said tube is biased against conduction during light reception by said solar cell.

2. In combination: a series circuit including a storage battery, a bias resistor, a solar cell in charging relationship to said battery, and a diode for preventing discharge of said battery through said solar cell; a series-connected resistor and capacitor combination coupled across said battery; and an inert gas filled triode tube having two terminal electrodes coupled across said capacitor, and having a control electrode coupled to the junction of said bias resistor and said solar cell whereby said tube is biased against conduction during light reception by said solar cell.

References Cited in the file of this patent

UNITED STATES PATENTS

| | | |
|---|---|---|
| 1,832,402 | Langer | Nov. 17, 1931 |
| 2,375,130 | Perrin et al. | May 1, 1945 |

| | | |
|---|---|---|
| 2,504,628 | Benzer | Apr. 18, 1950 |
| 2,577,352 | Mulder et al. | Dec. 4, 1951 |
| 2,658,141 | Kurland et al. | Nov. 3, 1953 |
| 2,780,765 | Chapin et al. | Feb. 5, 1957 |

OTHER REFERENCES

"Theory and Applications of Electron Tubes," Reich, McGraw-Hill Book Co., New York, 1944, page 454.

American Journal of Physics, vol. 18, No. 8, November 1950, page 516.